(12) United States Patent
Park

(10) Patent No.: US 8,039,889 B2
(45) Date of Patent: Oct. 18, 2011

(54) NON-VOLATILE MEMORY DEVICES INCLUDING STEPPED SOURCE REGIONS AND METHODS OF FABRICATING THE SAME

(75) Inventor: Weon-Ho Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 347 days.

(21) Appl. No.: 11/944,802

(22) Filed: Nov. 26, 2007

(65) Prior Publication Data
US 2008/0142872 A1   Jun. 19, 2008

(30) Foreign Application Priority Data

Dec. 14, 2006 (KR) .................. 10-2006-0128040

(51) Int. Cl.
*H01L 29/788* (2006.01)
(52) U.S. Cl. ........ 257/317; 257/224; 257/240; 257/243; 257/260; 257/305; 257/326; 257/E29.052; 257/E29.131
(58) Field of Classification Search .................. 257/317, 257/326, 224, 240, 243, 260, 305, E29.052, 257/E29.131
See application file for complete search history.

(56) References Cited

U.S. PATENT DOCUMENTS

| | | |
|---|---|---|
| 5,566,106 A | 10/1996 | Bergemont |
| 5,852,312 A | 12/1998 | Ahn |
| 5,953,602 A * | 9/1999 | Oh et al. .......... 438/201 |
| 6,362,504 B1 * | 3/2002 | Simpson .......... 257/317 |
| 2008/0061356 A1 * | 3/2008 | Kim et al. .......... 257/316 |

FOREIGN PATENT DOCUMENTS

| | | | |
|---|---|---|---|
| JP | 07-115142 | | 5/1995 |
| JP | 11-220044 | | 8/1999 |
| JP | 2000357753 A | * | 12/2000 |
| KR | 1020040072340 A | | 8/2004 |
| KR | 1020060067058 A | | 6/2006 |
| KR | 1020060072688 A | | 6/2006 |
| KR | 100648287 B1 | | 11/2006 |

OTHER PUBLICATIONS

English Machine Translation for JP 2000-357753A.*
Notice of Allowance for Korean patent application No. 10-2006-0128040; mailed Nov. 21, 2007.

* cited by examiner

*Primary Examiner* — Matthew E Warren
*Assistant Examiner* — David Chen
(74) *Attorney, Agent, or Firm* — Myers Bigel Sibley & Sajovec, P.A.

(57) ABSTRACT

A non-volatile memory device includes a semiconductor substrate having a first section including a substantially planar first top surface, a second section including a substantially planar second top surface, and a sidewall extending between the first and second top surfaces. The second top surface of the substrate is closer to a bottom surface of the substrate than is the first top surface. A charge storage pattern extends on the first and second top surfaces of the substrate and along the sidewall therebetween. A source region in the first section of the substrate extends from the first top surface into the second section of the substrate and has a stepped portion defined by the sidewall and the second top surface. Related fabrication methods and methods of operation are also discussed.

15 Claims, 4 Drawing Sheets

NON-VOLATILE MEMORY DEVICES INCLUDING STEPPED SOURCE REGIONS AND METHODS OF FABRICATING THE SAME

CROSS-REFERENCE TO RELATED APPLICATIONS

This application claims priority under 35 U.S.C §119 from Korean Patent Application 10-2006-0128040 filed on Dec. 14, 2006, the disclosure of which is hereby incorporated by reference herein in its entirety.

FIELD OF THE INVENTION

The present invention relates to semiconductor memory devices, and more particularly, to non-volatile memory devices and methods of fabricating the same.

BACKGROUND

Generally, semiconductor memory devices may be classified into volatile memory devices and non-volatile memory devices. Volatile memory devices may lose their stored data when their power supplies are interrupted, while non-volatile memory devices may retain their stored data even when their power supplies are interrupted. A flash memory device is a highly integrated non-volatile memory device developed by combining advantages of an erasable programmable read only memory (EPROM) with advantages of an electrically erasable programmable read only memory (EEPROM). A flash memory device may be classified as a NOR-type flash memory device or a NAND-type flash memory device. Since a NOR-type flash memory may be configured to control memory cells independently, operation speed of the NOR-type flash memory device may be relatively high.

FIG. 1 is a cross-sectional view illustrating a conventional non-volatile memory device. Referring to FIG. 1, a gate pattern 20 is provided on a semiconductor substrate 10. The gate pattern 20 includes a gate insulator 22, a charge storage layer 24, an interlayer dielectric 26, and a gate conductive layer 28, which are sequentially stacked on the semiconductor substrate 10. A source region 12 and a drain region 14 are provided at a semiconductor substrate adjacent to the gate pattern 20.

The operation of the non-volatile memory device of FIG. 1 will now be described. During an erase operation, a ground voltage may be applied to the gate conductive layer 28, and an erase voltage (e.g., 10-15 volts) may be applied to the source region 12. Charges stored in the charge storage layer 24 may be ejected to the source region 12 to thereby reduce a threshold voltage of the gate pattern 20.

During the erase operation, band-to-band tunneling (BTBT) current may be generated due to the high erase voltage. The BTBT current may result in generation of an electron-hole pair. The electron may reduce the erase voltage with the migration to the source region 12, and the hole may degrade the gate insulator 22. Punchthrough may be created due to the relatively high voltage of the source region 12, which may deteriorate erase efficiency and reliability of the non-volatile memory device.

SUMMARY OF THE INVENTION

According to some embodiments of the present invention, a non-volatile memory device includes a semiconductor substrate having first and second sections. The first section has a substantially planar first top surface, and the second section has a substantially planar second top surface that is closer to a bottom surface of the substrate than is the first top surface. A sidewall extends between the first and second top surfaces. A charge storage pattern extends on the first and second top surfaces of the substrate and along the sidewall therebetween. A source region in the first section of the substrate extends from the first top surface into the second section of the substrate and has a stepped portion defined by the sidewall and the second top surface.

In some embodiments, the non-volatile memory device may further include a drain region in the second section of the substrate. The drain region may extend from the second top surface toward the bottom surface of the substrate. The source region may extend toward the bottom surface of the substrate beyond the drain region.

In other embodiments, the non-volatile memory device may further include a tunnel insulating pattern on the first and second top surfaces of the substrate extending between the charge storage pattern and the stepped portion of the source region and between the charge storage pattern and a portion of the drain region. A surface of the tunnel insulating pattern on the source region may be further from the bottom surface of the substrate than is a surface of the tunnel insulating pattern on the drain region.

In some embodiments, a bottom surface of the charge storage pattern adjacent to the substrate may include a substantially planar first bottom surface on the first top surface of the substrate, a substantially planar second bottom surface on the second top surface of the substrate, and a second sidewall extending along the first sidewall of the substrate and between the first and second bottom surfaces of the charge storage pattern to define a corner portion. The corner portion may be adjacent to the stepped portion of the source region.

In other embodiments, an angle between the second bottom surface and the second sidewall of the charge storage pattern may be about 90 degrees or less. In some embodiments, the second sidewall may extend substantially perpendicular to the first and second bottom surfaces of the charge storage pattern.

In some embodiments, the non-volatile memory device may further include an interlayer dielectric pattern on the charge storage pattern opposite the tunnel insulating pattern, and a gate conductive pattern on the interlayer dielectric pattern.

In other embodiments, an angle between the sidewall and the second top surface of the substrate may be about 90 degrees or less. In some embodiments, the sidewall may extend substantially perpendicular to the first and second top surfaces of the substrate.

In some embodiments, a step difference between the first and second top surfaces of the substrate may be about 500 to about 1000 Angstroms (Å).

According to other embodiments of the present invention, a method of operating a non-volatile memory device including a charge storage pattern having source and drain regions on opposite sides thereof and a gate conductive pattern thereon includes applying a ground voltage to the gate conductive pattern and applying an erase voltage to the source region to emit charges from a corner of the charge storage pattern into a stepped portion of the source region adjacent thereto. The charge storage pattern may include a substantially planar first bottom surface, a substantially planar second bottom surface, and a second sidewall connecting the first and second substantially planar bottom surfaces and extending substantially perpendicular thereto to define the corner of the charge storage pattern.

In some embodiments, the erase voltage may be about 8-13 volts.

In other embodiments, a program voltage may be applied to the gate conductive pattern and a ground voltage may be applied to the source region to store charges in the charge storage pattern via channel hot electron injection.

According to further embodiments of the present invention, a method of fabricating a non-volatile memory device includes a forming a semiconductor substrate including a substantially planar first top surface, a substantially planar second top surface that is closer to a bottom surface of the substrate than is the first top surface, and a sidewall extending between the first and second top surfaces. A charge storage pattern is formed on the first and second top surfaces of the substrate and extending along the sidewall therebetween. A source region is formed in the first section of the substrate extending from the first top surface into the second section of the substrate and having a stepped portion defined by the sidewall and the second top surface.

In some embodiments, a substantially planar semiconductor substrate may be prepared, and a mask pattern may be formed on the first top surface of the substantially planar substrate. An etching process may be performed on the substantially planar substrate using the mask pattern as a mask to form the second top surface having a step difference relative to the first top surface and the sidewall extending between the first and second top surfaces.

In other embodiments, a gate pattern may be formed on the semiconductor substrate. The gate pattern may include a tunnel insulating pattern, the charge storage pattern, an interlayer dielectric pattern, and a gate conductive pattern. An ion implantation process may be performed using the gate pattern as a mask to form the source region and a drain region in the substrate on opposite sides of the gate pattern. The stepped portion of the source region may extend from the first top surface along the sidewall and at least a portion of the second top surface of the substrate.

In some embodiments, a charge storage layer may be conformally formed on the first and second top surfaces of the substrate and along the sidewall therebetween. The charge storage layer may be pattern to define the charge storage pattern. A bottom surface of the charge storage pattern adjacent to the substrate may include a substantially planar first bottom surface on the first top surface, a substantially planar second bottom surface on the second top surface, and a second sidewall extending between the first bottom surface and the second bottom surface to define a corner portion adjacent to the stepped portion of the source region.

In other embodiments, the source region may be formed to extend toward the bottom surface of the substrate beyond the drain region and below the first top surface, the second top surface, and the sidewall.

In some embodiments, the sidewall may be formed such that an angle between the sidewall and the second top surface of the substrate is about 90 degrees.

In other embodiments, the charge storage pattern may include polysilicon.

According to still further embodiments of the present invention, a non-volatile memory device may include: a semiconductor substrate including a first top surface, a second top surface lower than the first top surface, and a first side surface between the first top surface and the second top surface; a charge storage pattern provided on the first side surface and extending onto the first top surface and the second top surface; and a source region formed adjacent to the charge storage pattern and provided below the first top surface, the second top surface, and the first side surface.

According to still other embodiments of the present invention, a method of forming a non-volatile memory device may include: preparing a planar semiconductor substrate; forming a mask pattern on the planar semiconductor substrate; performing an etching process using the mask pattern as a mask to form a semiconductor substrate including a first top surface, a second top surface lower than the first top surface, and a side surface between the first top surface and the second top surface; forming a gate pattern on the semiconductor substrate including a tunnel insulating pattern, a charge storage pattern, an interlayer dielectric pattern, and a gate conductive pattern; and performing an ion implanting process using the gate pattern as a mask to form a source region and a drain region, wherein a bottom surface of the charge storage pattern includes a first bottom surface on the first top surface, a second bottom surface on the second top surface, and a second side surface between the first bottom surface and the second bottom surface, the second bottom surface being lower than the first bottom surface.

DETAILED DESCRIPTION OF EMBODIMENTS OF THE INVENTION

Figure 1:
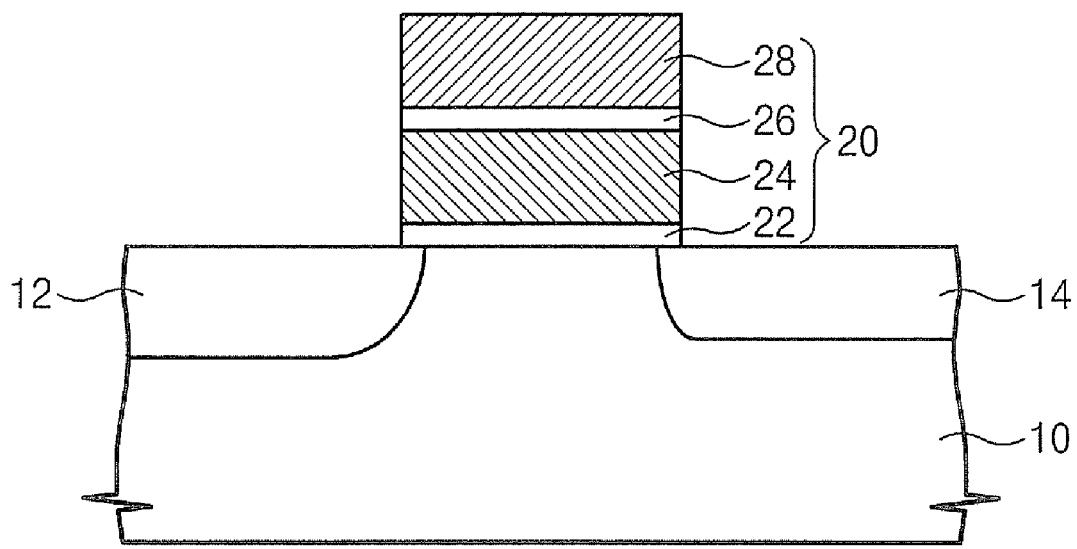
FIG. 1 is a cross-sectional view illustrating a conventional non-volatile memory device.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
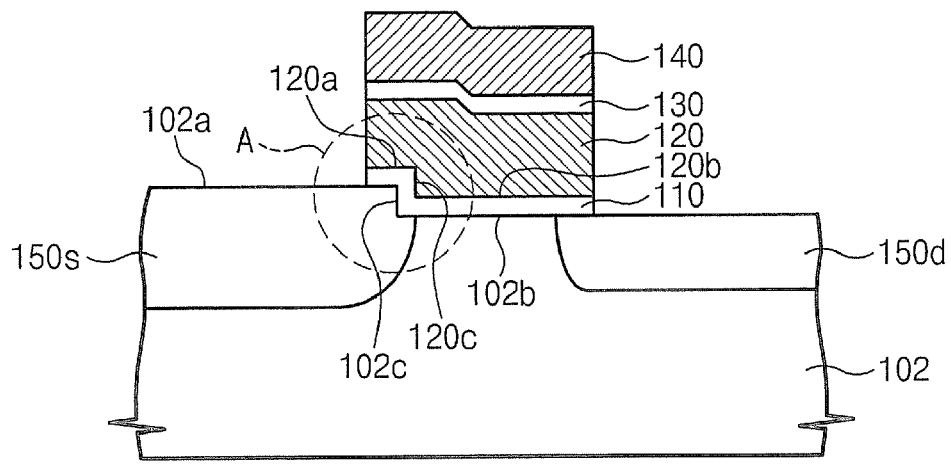
FIG. 2 is a cross-sectional view illustrating a non-volatile memory device according to some embodiments of the present invention.
Figure 3:
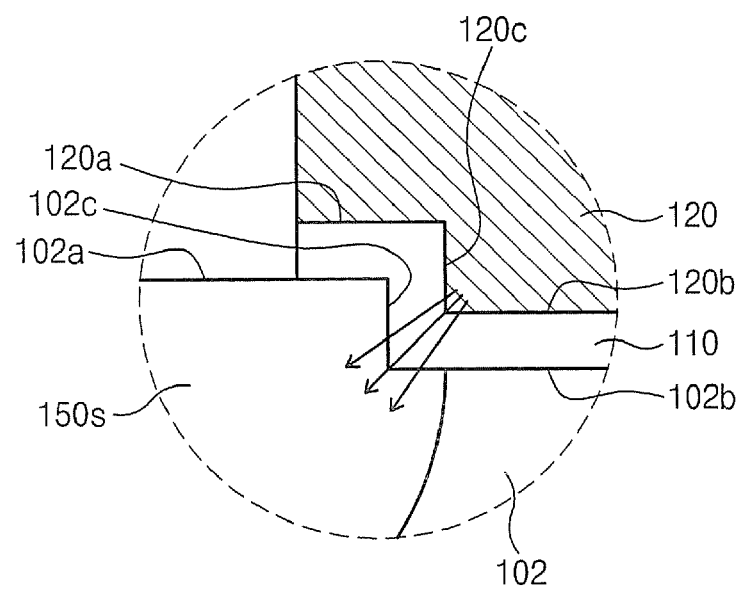
FIG. 3 is an enlarged cross-sectional view of a portion "A" shown in FIG. 2.

FIG. 2 is a cross-sectional view illustrating a non-volatile memory device according to some embodiments of the present invention, and FIG. 3 is an enlarged cross-sectional view of a portion "A" shown in FIG. 2.

Referring to FIGS. 2 and 3, a semiconductor substrate 102 is provided. The semiconductor substrate 102 includes a substantially planar first top surface 102a, a substantially planar second top surface 102b that is lower than the first top surface 102a, and a first sidewall 102c extending between the first top surface 102a and the second top surface 102b that defines a step difference between the first top surface 102a and the second top surface 102b. The angle formed by the intersection of the second surface 102b and the first sidewall 102c may be approximately 90 degrees or less. In some embodiments, the first sidewall 102c may extend substantially perpendicular to both the first and second top surfaces 102a and 102b of the substrate 102. The first sidewall 102c may have a height ranging from about 500 to about 1,000 angstroms (Å). A charge storage pattern 120 is provided on the first sidewall 102c. The charge storage pattern 120 may include polysilicon and may function as a floating gate in a NOR-type flash memory device. The charge storage pattern 120 may extend from the first sidewall 102c to the first surface 102a and from the first sidewall 102c to the second surface 102b.

A bottom surface of the charge storage pattern 120 adjacent to the substrate 102 may include a first bottom surface 120a on the first surface 102a, a second bottom surface 120b on the second surface 102b, and a second sidewall 120c extending between the first bottom surface 120a and the second bottom surface 120b that defines a relatively sharp corner portion of the charge storage pattern 120. The angle formed by the intersection of the second bottom surface 120b and the second sidewall 120c may be approximately 90 degrees or less. In some embodiments, the second sidewall 120c may extend substantially perpendicular to both the first and second bottom surfaces 120a and 120b of the charge storage pattern 120. A tunnel insulating pattern 110 is provided between the charge storage pattern 120 and the semiconductor substrate 102. The tunnel insulating pattern 110 may include silicon oxide. An interlayer dielectric pattern 130 is provided on the charge storage pattern 120. The interlayer dielectric pattern 130 may include oxide-nitride-oxide (ONO). A gate conductive pattern 140 is provided on the interlayer dielectric pattern 130. The gate conductive pattern 140 may include polysilicon.

A source region 150s and a drain region 150d are provided in the semiconductor substrate 102 adjacent to the charge storage pattern 120 on opposite sides thereof. The source region 150s may be provided below the first surface 102a, the second surface 102b, and the first sidewall 102c, and may have a stepped portion defined by the step difference in the substrate 102. The stepped portion of the source region 102 is adjacent to the corner portion of the charge storage pattern 120. Accordingly, the step difference in the substrate 102 may define both the corner portion of the charge storage pattern 120 and the stepped portion of the source region 150s such that the two are matably adapted. The drain region 150d may be provided below the second surface 102b. However, the drain region 150d does not include a stepped portion. A junction of the source region 150s may be deeper than that of drain region 150d, because a relatively higher voltage (i.e., the erase voltage) may be applied to the source region 150s than the drain region 150d.

An erase operation of the non-volatile memory device according to some embodiments of the present invention will now be described with reference to FIGS. 2 and 3.

In the erase operation, a ground voltage is applied to the gate conductive pattern 140, and an erase voltage is applied to the source region 150s. Charges stored in the charge storage pattern 120 are ejected to the source region 150s from the corner portion or "tip" where the second sidewall 120c and the second bottom surface 120b intersect (as illustrated by the arrows in FIG. 3). The erase voltage may be, for example, about 8-13 volts. The erase voltage may be lower than a conventional erase voltage (about 10-15 volts) due to the concentration of the electric field at the tip/corner portion of the charge storage pattern 120 where the second sidewall 120c and the second bottom surface 120b intersect. In other words, the non-volatile memory device may have an improved erase efficiency due to the electric field concentration, and may thereby be operated at a lower voltage.

A program operation of the non-volatile memory device according to some embodiments of the present invention will now be described below.

In the program operation, a program voltage (e.g., about 8-15 volts) is applied to the gate conductive pattern 140, a voltage of about 4-10 volts is applied to the drain region 150d, and a ground voltage is applied to the source region 150s. Hot electrons flowing in the channel region between the source region 150s and the drain region 150d are partially injected into the charge storage pattern 120. Thus, the threshold voltage of the non-volatile memory device may be increased by about 3-8 volts.

FIGS. 4A through 4D are cross-sectional views illustrating methods of forming non-volatile memory devices according to some embodiments of the present invention.

Figure 4A:
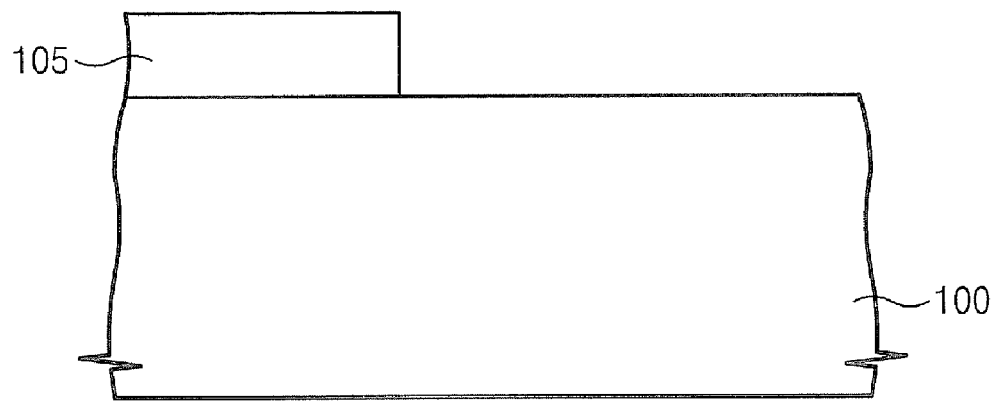
FIGS. 4A through 4D are cross-sectional views illustrating methods of fabricating non-volatile memory devices according to some embodiments of the present invention.

Referring to FIG. 4A, a substantially planar semiconductor substrate 100 is prepared. A mask pattern 105 is formed on the planar semiconductor substrate 100. The mask pattern 105 may include a photoresist pattern.

Figure 4B:
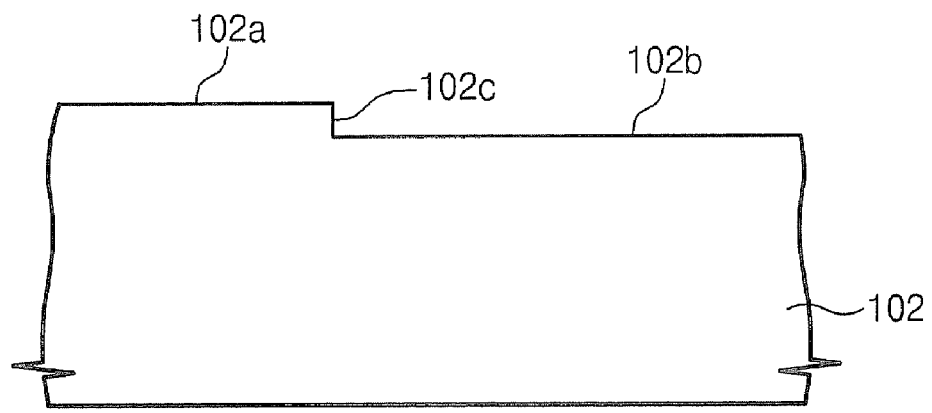

Referring to FIG. 4B, an etching process is performed using the mask pattern 105 as a mask to form a semiconductor substrate 102 including a substantially planar first surface 102a, a substantially planar second surface 102b lower than the first surface 102a, and a first sidewall 102c extending between the first surface 102a and the second surface 102b. The sidewall 102c defines a step difference between the first top surface 102a and the second top surface 102b. The angle formed by the intersection of the second surface 102b and the first sidewall 102c may be approximately 90 degrees.

Figure 4C:
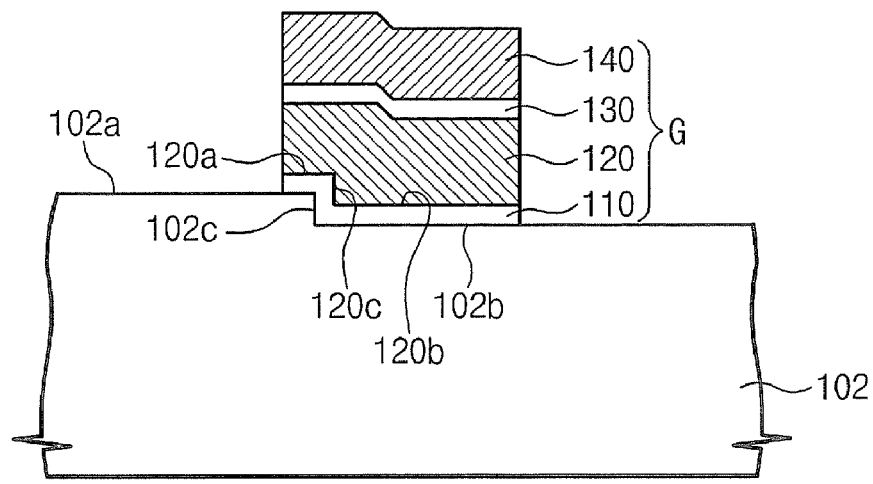

Referring to FIG. 4C, a gate pattern G is formed on the semiconductor substrate 102. The gate pattern G includes a tunnel insulating pattern 110, a charge storage pattern 120, an interlayer dielectric pattern 130, and a gate conductive pattern 140, which are stacked in the order listed. The tunnel insulating pattern 110 may include silicon oxide formed, for example, by a thermal oxidation process. The charge storage pattern 120 and the gate conductive pattern 140 may include polysilicon formed, for example, by chemical vapor deposition (CVD). The interlayer dielectric pattern 130 may be formed of oxide-nitride-oxide (ONO). A bottom surface of the charge storage pattern 120 adjacent to the substrate 102 may be formed to include a first bottom surface 120a on the first surface 102a, a second bottom surface 120b lower than the first bottom surface 120a, and a second sidewall 120c extending between the first bottom surface 120a and the second bottom surface 120b that defines a relatively sharp corner portion. The angle formed by the intersection of the second bottom surface 120b and the second sidewall 120c may be approximately 90 degrees. Thus, the charge storage pattern 120 may have a tip or corner where the second sidewall 120c and the second bottom surface 120b intersect.

Figure 4D:
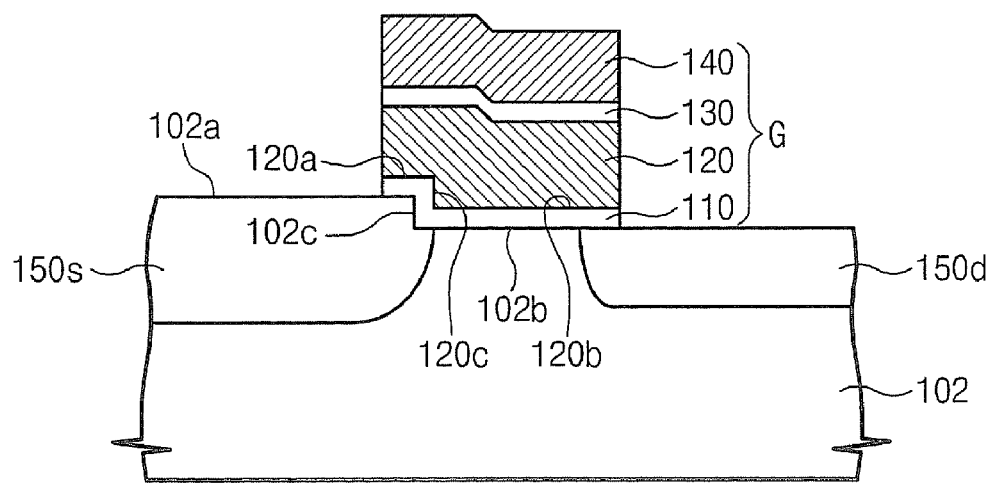

Referring to FIG. 4D, an ion implanting process is performed using the gate pattern G as a mask to form a source region 150s and a drain region 150d. The source region 150s is formed below the first surface 102a, the second surface 102b, and the first sidewall 102c, and has a stepped portion defined by the step difference in the substrate 102 adjacent to the corner portion of the charge storage pattern 120. The drain region 150d may be formed below the second surface 102b.

As described above, a bottom surface of a charge storage pattern is formed in a stepwise pattern to define a relatively sharp corner portion where an electric field is concentrated. The source region similarly includes a stepped portion adjacent to the corner portion of the charge storage pattern 120. Thus, an erase voltage applied to the source region may be decreased to improve erase efficiency of a non-volatile memory device.

Although the present invention has been described in connection with the embodiments of the present invention illustrated in the accompanying drawings, it is not limited thereto. It will be apparent to those skilled in the art that various substitutions, modifications and changes may be made without departing from the scope and spirit of the invention.

That which is claimed:

1. A non-volatile memory device, comprising:
   a semiconductor substrate including a first section having a substantially planar first top surface, a second section having a substantially planar second top surface that is closer to a bottom surface of the substrate than is the first top surface, and a sidewall extending between the first and second top surfaces;
   a charge storage pattern on the first and second top surfaces of the substrate and extending along the sidewall therebetween;
   a source region in the first section of the substrate extending from the first top surface into the second section of the substrate and having a stepped portion defined by the sidewall and the second top surface; and
   a drain region in the second section of the substrate extending from the second top surface toward the bottom surface of the substrate,
   wherein the source region and the drain region are asymmetrical in cross-section,
   wherein the drain region has a substantially planar surface facing an overall bottom surface of the charge storage pattern and a different upper surface from the source region, wherein an entirety of the drain region is confined below the substantially planar second top surface of the second section of the substrate, and
   wherein the source region extends toward the bottom surface of the substrate beyond the drain region.

2. The non-volatile memory device of claim 1, further comprising:
   a tunnel insulating pattern on the first and second top surfaces of the substrate extending between the charge storage pattern and the stepped portion of the source region and between the charge storage pattern and a portion of the drain region,
   wherein a surface of the tunnel insulating pattern on the source region is further from the bottom surface of the substrate than is a surface of the tunnel insulating pattern on the drain region.

3. The non-volatile memory device of claim 2, wherein the bottom surface of the charge storage pattern adjacent to the substrate comprises:
   a substantially planar first bottom surface on the first top surface of the substrate;
   a substantially planar second bottom surface on the second top surface of the substrate; and
   a second sidewall extending along the first sidewall of the substrate and between the first and second bottom surfaces of the charge storage pattern to define a corner portion adjacent to the stepped portion of the source region.

4. The non-volatile memory device of claim 3, wherein an angle between the second bottom surface and the second sidewall of the charge storage pattern is about 90 degrees or less, and wherein the second sidewall and the substantially planar second bottom surface of the charge storage pattern intersect to define a vertex of the angle adjacent to the stepped portion of the source region.

5. The non-volatile memory device of claim 3, wherein the second sidewall extends substantially perpendicular to the first and second bottom surfaces of the charge storage pattern.

6. The non-volatile memory device of claim 2, further comprising:
    an interlayer dielectric pattern on the charge storage pattern opposite the tunnel insulating pattern; and
    a gate conductive pattern on the interlayer dielectric pattern.

7. The non-volatile memory device of claim 1, wherein an angle between the sidewall and the second top surface of the substrate is about 90 degrees or less.

8. The non-volatile memory device of claim 1, wherein the sidewall extends substantially perpendicular to the first and second top surfaces of the substrate.

9. The non-volatile memory device of claim 1, wherein a step difference between the first and second top surfaces of the substrate is about 500 to about 1000 Angstroms (Å).

10. A method of fabricating a non-volatile memory device, the method comprising:
    forming a semiconductor substrate including a first section having a substantially planar first top surface, a second section having a substantially planar second top surface that is closer to a bottom surface of the substrate than is the first top surface, and a sidewall extending between the first and second top surfaces;
    forming a charge storage pattern on the first and second top surfaces of the substrate and extending along the sidewall therebetween;
    forming a source region in the first section of the substrate extending from the first top surface into the second section of the substrate and having a stepped portion defined by the sidewall and the second top surface; and
    forming a drain region in the second section of the substrate extending from the second top surface toward the bottom surface of the substrate,
    wherein the source region and the drain region are asymmetrical in cross-section, wherein the drain region has a substantially planar surface facing an overall bottom surface of the charge storage pattern and a different upper surface from the source region, wherein an entirety of the drain region is confined below the substantially planar second top surface of the second section of the substrate, and wherein the source region extends toward the bottom surface of the substrate beyond the drain region.

11. The method of claim 10, wherein fanning the substrate comprises:
    preparing a substantially planar semiconductor substrate;
    forming a mask pattern on the first top surface of the substantially planar substrate;
    performing an etching process on the substantially planar substrate using the mask pattern as a mask to form the second top surface having a step difference relative to the first top surface and the sidewall extending between the first and second top surfaces.

12. The method of claim 10, wherein forming the source region comprises:
    forming a gate pattern on the semiconductor substrate including a tunnel insulating pattern, the charge storage pattern, an interlayer dielectric pattern, and a gate conductive pattern; and
    performing an ion implantation process using the gate pattern as a mask to form the source region and the drain region in the substrate on opposite sides of the gate pattern,
    wherein the stepped portion of the source region extends from the first top surface along the sidewall and along at least a portion of the second top surface of the substrate.

13. The method of claim 12, wherein forming the charge storage pattern comprises:
    conformally forming a charge storage layer on the first and second top surfaces of the substrate and along the sidewall therebetween; and
    patterning the charge storage layer to define the charge storage pattern,
    wherein the bottom surface of the charge storage pattern adjacent to the substrate includes a substantially planar first bottom surface on the first top surface, a substantially planar second bottom surface on the second top surface, and a second sidewall extending between the first bottom surface and the second bottom surface to define a corner portion adjacent to the stepped portion of the source region, wherein an angle between the second bottom surface and the second sidewall is about 90 degrees or less, and wherein the second sidewall and the second bottom surface of the charge storage pattern intersect to define a vertex of the angle.

14. The method of claim 12, wherein the forming the source region further comprises:
    forming the source region extending toward the bottom surface of the substrate beyond the drain region and below the first top surface, the second top surface, and the sidewall.

15. The method of claim 10, wherein forming the substrate comprises forming the sidewall such that an angle between the sidewall and the second top surface of the substrate is about 90 degrees.

\* \* \* \* \*